United States Patent
Gong et al.

(10) Patent No.: US 10,804,890 B2
(45) Date of Patent: Oct. 13, 2020

(54) CONTROL OF A PASS SWITCH BY A CURRENT SOURCE

(71) Applicant: Infineon Technologies Austria AG, Villach (AT)

(72) Inventors: Xiaowu Gong, Singapore (SG); Andrey Malinin, Fort Collins, CO (US)

(73) Assignee: Infineon Technologies Austria AG, Villach (AT)

(*) Notice: Subject to any disclaimer, the term of this patent is extended or adjusted under 35 U.S.C. 154(b) by 12 days.

(21) Appl. No.: 15/802,258

(22) Filed: Nov. 2, 2017

(65) Prior Publication Data
US 2019/0131963 A1    May 2, 2019

(51) Int. Cl.
*H03K 17/041* (2006.01)
*H03K 17/0424* (2006.01)

(52) U.S. Cl.
CPC ... *H03K 17/04106* (2013.01); *H03K 17/0424* (2013.01); *H03K 2217/0054* (2013.01)

(58) Field of Classification Search
CPC ........ H03K 17/04106; H03K 17/0424; H02M 3/04; H02M 3/155
See application file for complete search history.

(56) References Cited

U.S. PATENT DOCUMENTS

| | | | | |
|---|---|---|---|---|
| 5,404,095 A * | 4/1995 | Lammers | ............... | H02M 3/155 315/209 R |
| 5,475,329 A * | 12/1995 | Jones | ............... | H03K 17/04206 327/108 |
| 6,297,970 B2 * | 10/2001 | Hemena | ................ | H02M 1/083 363/127 |
| 8,023,291 B2 * | 9/2011 | Sato | .................... | G01R 19/0084 363/127 |
| 8,802,509 B2 * | 8/2014 | Su | ....................... | H01L 27/0255 438/128 |
| 2015/0131339 A1 * | 5/2015 | Furukawa | ......... | H02M 3/33584 363/21.04 |

OTHER PUBLICATIONS

"Forced Frequency Resonant Flyback controller," Infineon Data Sheet: XDPS21071, Retrieved from: https://www.infineon.com/dgdl/Infineon-XDPS21071-DataSheet-v01_00-EN.pdf fileId=5546d4626e41e490016e632b3d382b14, Revision 2.0, Oct. 30, 2019, 54 pp.

(Continued)

*Primary Examiner* — Lincoln D Donovan
*Assistant Examiner* — Colleen J O Toole
(74) *Attorney, Agent, or Firm* — Shumaker & Sieffert, P.A.

(57) ABSTRACT

In some examples, a controller is configured to control a power switch electrically connected in series with a winding. In some examples, the controller is also configured to control a pass switch electrically connected between an output node of the winding and a bus out node. In some examples, the controller includes a current source configured to selectively drive a charging current from an intermediate node between the power switch and the winding to a control terminal of the pass switch to turn on the pass switch.

20 Claims, 7 Drawing Sheets

(56) References Cited

OTHER PUBLICATIONS

"TEA19051BTK USB-PD 2.0/USB-PD 3.0/QC 2.0/QC 3.0/QC 4 (+) controller for SMPS," NXP Product Data Sheet: TEA19051BTK, Retreived from: https://www.nxp.com/docs/en/data-sheet/TEA19051BTK.pdf, Revision 3, Jan. 21, 2019, 60 pp.

"Highly Integrated Secondary-Side Adaptive USB Type-C Charging Controller with USB-PD with SR Embedded," ON Semiconductor FAN6390MPX, Retrieved from: https://www.onsemi.com/pub/Collateral/FAN6390-D.PDF, Revision 1, Nov. 2019, 25 pp.

\* cited by examiner

CONTROL OF A PASS SWITCH BY A CURRENT SOURCE

TECHNICAL FIELD

This disclosure relates to controllers for power electronics.

BACKGROUND

A power electronics system may include a transformer to provide galvanic isolation between the primary side and the secondary side of the power electronics system. The secondary side of a power electronics system may include a pass switch configured to conduct electricity between a secondary-side winding of the transformer and an electrical load. The power electronics system may include secondary-side controller configured to control the pass switch.

SUMMARY

This disclosure describes techniques for controlling a pass switch of a power electronics system. A controller may include a current source configured to drive a charging current to the control terminal of the pass switch. The current source may be configured to draw the charging current from an intermediate node between a transformer winding and a power switch.

In some examples, a controller is configured to control a power switch electrically connected in series with a winding. In some examples, the controller is also configured to control a pass switch electrically connected between an output node of the winding and a bus out node. In some examples, the controller includes a current source configured to selectively drive a charging current from an intermediate node between the power switch and the winding to a control terminal of the pass switch to turn on the pass switch.

In some examples, a method includes controlling, by a controller, a power switch electrically connected in series with a winding. The method also includes controlling, by the controller, a pass switch electrically connected between an output node of the winding and a bus out node. Controlling the pass switch comprises selectively driving, by a current source of the controller, a charging current from an intermediate node between the power switch and the winding to a control terminal of the pass switch to turn on the pass switch.

A system includes primary-side circuitry including a primary-side switch, a primary-side winding of a transformer, and a primary-side controller configured to control the primary-side switch. The system also includes secondary-side circuitry including a secondary-side switch and a secondary-side winding of the transformer magnetically coupled to the primary side and electrically connected in series with the secondary-side switch through an intermediate node. The secondary-side circuitry also includes a bus out node configured to deliver electrical power to an electrical load and a pass switch configured to conduct electricity from an output node of the secondary-side winding to the bus out node. The secondary-side circuitry further includes a secondary-side controller configured to control the secondary-side switch and the pass switch, wherein the secondary-side controller comprises a current source configured to selectively drive a charging current from the intermediate node between the secondary-side switch and the secondary-side winding to a control terminal of the pass switch to turn on the pass switch.

The details of one or more examples are set forth in the accompanying drawings and the description below. Other features, objects, and advantages will be apparent from the description and drawings, and from the claims.

DETAILED DESCRIPTION

This disclosure describes a device and a method for driving a pass switch of a power electronics system. The pass switch may be electrically connected in series between an output node of a winding of the power electronics system and a bus out node for an electrical load. A controller may include a current source configured to deliver a charging current to a control terminal of the pass switch. The current source may be configured to draw the charging current from an intermediate node between the winding and a power switch.

In some examples, the controller may not include a charge pump for delivering the charging current to the control terminal of the pass switch. A charge pump may take up more space in a controller, may include complex circuitry, may consume more power, and may generate more heat, as compared to a current source. In addition, the intermediate node (e.g., drain node of the power switch) may provide a more stable power supply than a rectified voltage supply of the power electronics system. The intermediate node may also have a higher voltage level than the rectified voltage supply. Thus, the current source may able to deliver the charging current more easily from the intermediate node than from the output node.

Figure 1:
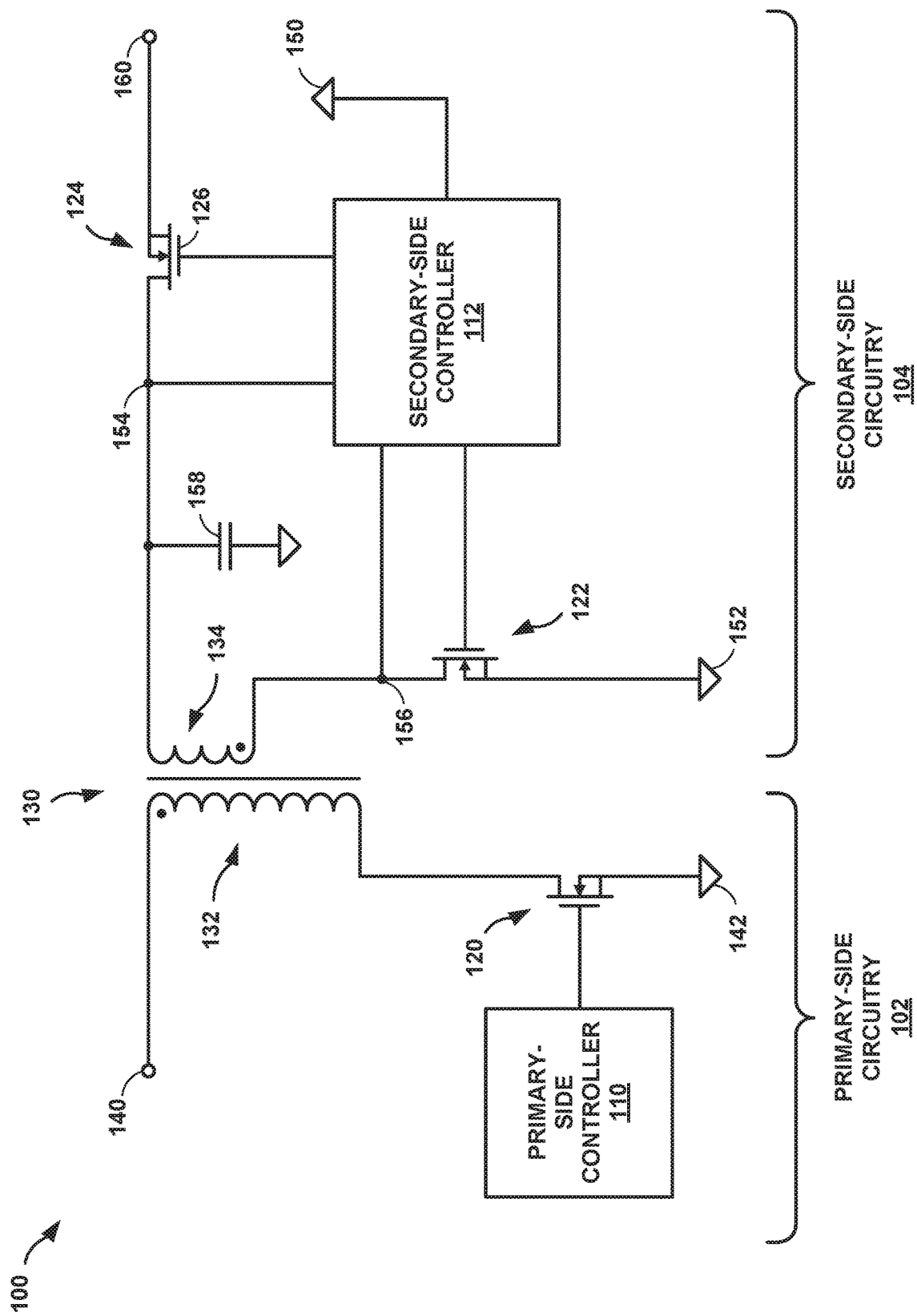
FIG. 1 is a conceptual block and circuit diagram of a power electronics system including primary-side circuitry and secondary-side circuitry, in accordance with some examples of this disclosure.

FIG. 1 is a circuit diagram of a power electronics system 100 including primary-side circuitry 102 and secondary-side circuitry 104, in accordance with some examples of this disclosure. Power electronics system 100 may include a power conversion device, an analog electrical device, an embedded system, an integrated circuit (IC) device, a motor driver circuit, and/or any other electrical device. In some examples, power electronics system 100 may include an alternating-current-to-direct-current (ACDC) conversion device, a DC/DC conversion device, and/or any other conversion device. In some examples, power electronics system 100 may include a flyback conversion circuit, a buck conversion circuit, a boost conversion circuit, a buck-boost conversion circuit, a resonant-mode conversion circuit, a half-bridge circuit, an H-bridge circuit, and/or other conversion circuit. In some examples, power electronics system 100 may be part of a universal serial bus (USB) power delivery (USB-PD) system.

Primary-side circuitry 102 may include primary controller 110 (i.e., primary-side controller 110), primary switch 120 (i.e., primary-side switch 120), primary winding 132 of transformer 130 (i.e., primary-side winding 132), and voltage rails 140 and 142. Primary-side circuitry 102 may be configured to receive electrical power at voltage rail 140 through a rectification circuit if power electronics system 100 is connected to an AC power supply. The rectification circuit may be configured to convert AC electricity from, for example, an electrical grid to DC electricity. Voltage rails 140 and 142 may be configured to deliver DC electricity to primary switch 120 and primary winding 132. The voltage level of voltage rail 140 may be the voltage across a bulk capacitor (not shown in FIG. 1) of primary-side circuitry 102.

Secondary-side circuitry 104 may include secondary controller 112 (i.e., secondary-side controller 112 or synchronous rectifier controller 112), secondary switch 122 (i.e., secondary-side switch 122), pass switch 124, secondary winding 134 of transformer 130 (i.e., secondary-side winding 134), voltage rails 150 and 152, output node 154, intermediate node 156 (e.g., drain node 156), bus out node 160 (e.g., electrical load node 160). Bus out node 160 may include any node configured to deliver electrical power to an electrical load and/or receive electrical power from a source. Bus out node 160 may include one or more wires or any other electrical carriers electrically connected in parallel. In some examples, bus out node 160 may include a single electrical carrier. Voltage rail 150 (e.g. $V_{CC}$ voltage supply) may receive a rectified voltage supply from output node 154. Secondary-side circuitry 104 may be configured to receive, or transfer, electrical power through secondary winding 134. When primary switch 120 is turned off, the voltage level across winding 134 may be relatively low.

Output node 154 and intermediate node 156 may be located on opposite sides of winding 134. Winding 134 may be electrically connected to pass switch 124 by output node 154. Winding 134 may be electrically connected to power switch 122 by intermediate node 156. Capacitor 158 may be configured to store and/or supply electrical charge for output node 154. Capacitor 158 may also be configured to smooth out fluctuations in the voltage level at output node 154.

The output voltage of power electronics system 100 and the output voltage of secondary-side circuitry 104 may be measured between bus out node 160 and low-side voltage rail 152. The voltage level of voltage rail 150 may be approximately ten volts. The voltage level of output node 154 may be in the operation range of between three volts and twenty volts.

Secondary winding 134 may be configured to conduct electricity between nodes 154 and 156, depending on the direction of the electrical currents flowing through windings 132 and 134. For example, when primary switch 120 is active, intermediate node 156 may have a high voltage level. Secondary controller 112 may be configured to use the higher voltage level at intermediate node 156 to deliver electrical charge to control terminal 126 of pass switch 124. Pass switch 124 may include parasitic capacitance between control terminal 126 and output node 154, which may be referred to as a gate-drain capacitance if pass switch 124 includes a n-type field-effect transistor (NFET).

Primary controller 110 may be configured to control the operations of primary switch 120 by delivering control signals to a control terminal of primary switch 120. Secondary controller 112 may be configured to control the operations of secondary switch 122 and pass switch 124 by delivering control signals to a control terminal of secondary switch 122 and control terminal 126 of pass switch 124. Switches 120, 122, and 124 may be power switches such as, but not limited to, any type of FET, a bipolar junction transistor (BJT), an insulated-gate bipolar transistor (IGBT), a high-electron-mobility transistor (HEMT), a gallium-nitride (GaN) based transistor, or another element that uses voltage for its control. Switches 120, 122, and 124 may include n-type transistors or p-type transistors and may be power transistors. In some examples, switches 120, 122, and 124 may be vertical transistors, lateral transistors, and/or horizontal transistors. In some examples, switches 120, 122, and 124 may include other analog devices such as diodes and/or thyristors. Switches 120, 122, and 124 may also include a freewheeling diode connected in parallel with a transistor to prevent reverse breakdown of the transistor. In some examples, the switches 120, 122, and 124 may operate as switches and/or as analog devices.

Each of switches 120, 122, and 124 may include three terminals: two load terminals and a control terminal. For metal-oxide-semiconductor field-effect transistor (MOSFET) switches, switches 120, 122, and 124 may include a drain terminal, a source terminal, and at least one gate terminal, where the control terminals are gate terminals. For BJT switches, control terminals may be base terminals. Current may flow between the load terminals of switches 120, 122, and 124, based on the voltage at control terminals.

Switches 120, 122, and 124 may include various material compounds, such as silicon (Si), silicon carbide (SiC), Gallium Nitride (GaN), or any other combination of one or more semiconductor materials. To take advantage of higher power density requirements in some circuits, power converters may operate at higher frequencies. In some examples, silicon carbide switches may experience lower switching power losses. Improvements in magnetics and faster switching, such as Gallium Nitride switches, may support higher frequency converters. These higher frequency circuits may require control signals to be sent with more precise timing, as compared to lower-frequency circuits. In some examples, power electronics system 100 may be configured to operate at switching frequencies of one hundred kilohertz, two hundred kilohertz, fifty kilohertz, and/or any other suitable frequency. In some examples, the time durations described may be fractions of a switching period, such that a ringing time may be on the order of one or two microseconds, and a charging time may be on the order of two hundred or five hundred nanoseconds.

Controllers 110 and 112 may be configured to deliver control signals to the control terminals of switches 120, 122, and 124 to control the flow of electricity between the load terminals of switches 120, 122, and 124. The control signals delivered by controllers 110 and 112 may be square waveforms with an enabling period and a non-enabling period. The enabling period of a control signal, for example, may be the period of time during which the control signal enables a respective switch to conduct electricity between the load terminals of the respective switch. A controller may be configured to deliver and sustain an enabling control signal or a non-enabling control signal for a time interval such as a ringing time or a charging time. In some examples, a control signal may be referred to as one or more control signals that last for a certain amount of time. There may be time intervals during which controllers 110 and 112 cause zero, one, or both of switches 120, 122, and 124 to conduct electricity.

In accordance with the techniques of this disclosure, secondary controller 112 may be configured to deliver a charging current to control terminal 126 of pass switch 124. Controller 112 may include a current source configured to selectively drive the charging current from intermediate node 156 to control terminal 126 to turn on pass switch 124. Intermediate node 156 may provide a higher voltage level and a more stable power supply, as compared to voltage rail 150. The voltage level of intermediate node 156 may be equal to the voltage level of voltage rail 140 ($V_{IN}$) divided by the turns ratio of transformer 130 ($n$) plus the voltage level at output node 154 ($V_{OUT}$), as shown in Equation (1) when primary switch 120 is turned on.

$$V_{node\ 156} V_{IN}/n + V_{OUT} \qquad (1)$$

Pass switch 124 may include an n-type MOSFET (i.e., an NMOSFET). When turned on, pass switch 124 may be configured to deliver electrical power to bus out node 160. Controller 112 may be configured to turn off pass switch 124 when there is not any power requirement at bus out node 160. To turn on pass switch 124, controller 112 may be configured to deliver and cause the voltage level at control terminal 126 to exceed the voltage level at bus out node 160 by a threshold voltage, such as seven volts if pass switch 124 is an NMOSFET. For an NMOSFET, the difference between the voltage level at control terminal 126 and the voltage level at bus out node 160 may be a gate-source voltage level (VGS). In some examples, the threshold voltage for VGS may be between five volts and ten volts or between three volts and ten volts.

The voltage level of output node 154 may be approximately ten volts, which may not be sufficient to always exceed the voltage level of bus out node 160 by the threshold voltage. Thus, another controller may use a charge pump circuit to deliver a charging current from a voltage rail to the control terminal of a pass switch. However, the charge pump circuit may include complex circuitry that takes up considerable chip space. Therefore, a current source configured to drive a charging current from intermediate node 156 to control terminal 126 may be smaller, less complex, and consume less power. In addition, the current source of controller 112 may be independent of the voltage level of output node 154, which may fluctuate.

Another existing system may include a p-type MOSFET (PMOSFET) as a pass switch in order to reduce the turn-on voltage threshold for the control terminal of the pass switch. However, a PMOSFET may be much more expensive than an NMOSFET with a similar on-resistance.

Figure 2:
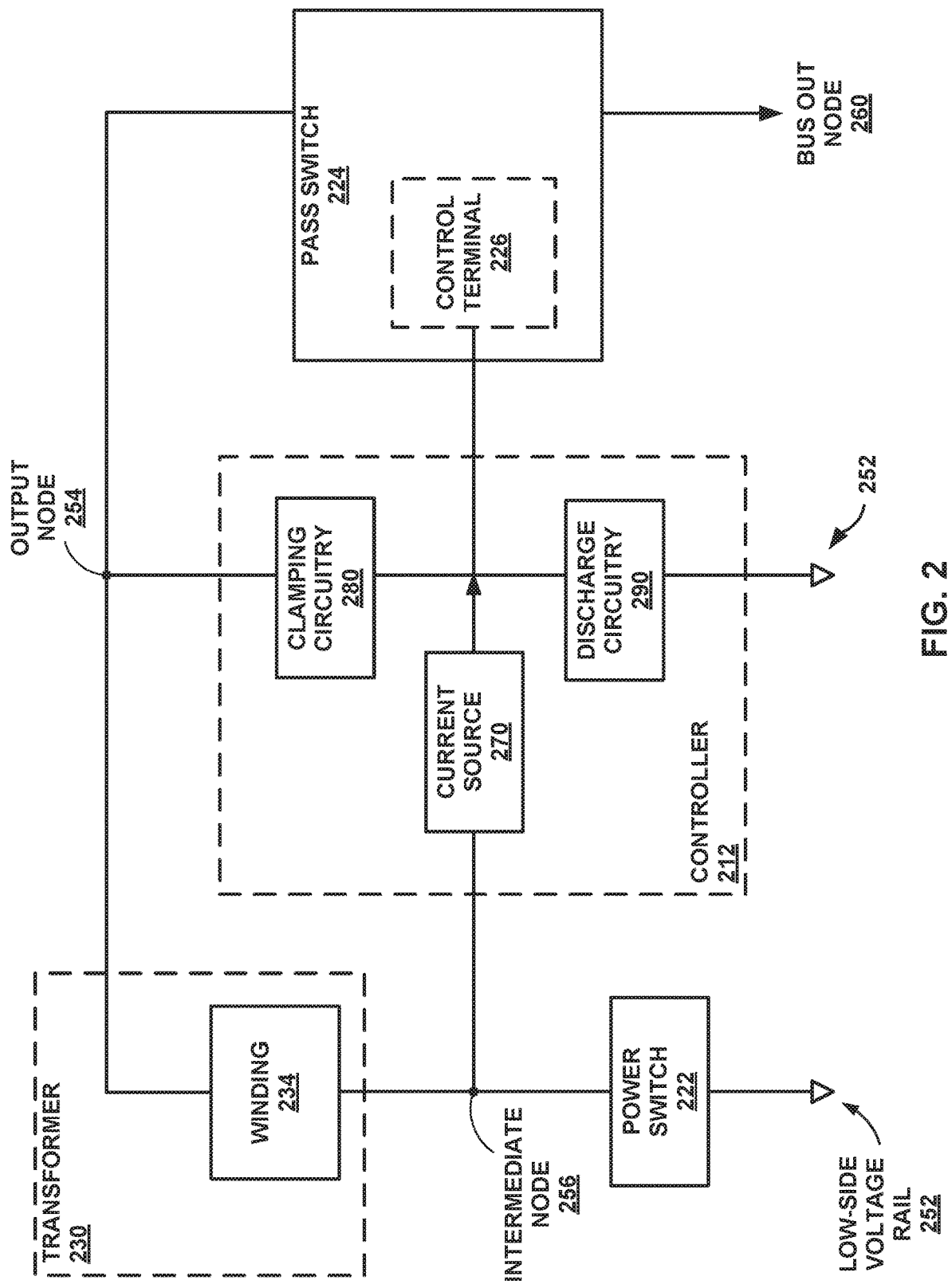
FIG. 2 is a conceptual block diagram of the secondary-side circuitry of a power electronics system, in accordance with some examples of this disclosure.

FIG. 2 is a conceptual block diagram of the secondary-side circuitry of a power electronics system, in accordance with some examples of this disclosure. The secondary-side circuitry includes controller 212, switches 222 and 224, and winding 234 of transformer 230. Current source 270 of controller 212 may be configured to selectively drive a charging current from intermediate node 256 to control terminal 226 to turn on pass switch 224. Current source 270 may selectively drive the charging current from intermediate node 256 in response to receiving a control signal from control circuitry of controller 212.

Clamping circuitry 280 may be configured to allow an electrical current to flow from control terminal 226 to output node 254 when the voltage level of control terminal 226 exceeds the voltage level of output node 254 by at least a threshold level. Clamping circuitry 280 may be configured to prevent damage to pass switch 224 by discharging excessive charge at control terminal 226. Clamping circuitry 380 of FIG. 3 and clamping circuitry 480 of FIG. 4A are example arrangements for clamping circuitry 280.

For example, pass switch 224 may include a breakdown voltage threshold between control terminal 226 and bus out node 260 (e.g., VGS). If pass switch 224 is turned on, the voltage levels of output node 254 and bus out node 260 may be approximately equal because electricity is flowing between the load terminals (e.g., the source and drain terminals) of pass switch 224. Clamping circuitry may allow electrical current to flow from control terminal 226 to output node 254 to reduce the voltage difference between control terminal 226 and bus out node 260. Clamping circuitry 280 may be configured to limit the voltage difference between control terminal 226 and bus out node 260, so that the voltage difference does not become too high. In some examples, the maximum voltage difference may be approximately twenty volts. In some examples, the terminal of pass switch 224 that is electrically connected to bus out node 260 (e.g., the source terminal) may be difficult to access for a connection to a clamping circuit. Clamping circuitry 280 may be configured to protect pass switch 224 from breakdown without connecting to bus out node 260.

Discharge circuitry 290 may be configured to selectively allow electrical current to flow from control terminal 226 to the low-side voltage rail 252 to turn off pass switch 224. Discharge circuitry 290 may be configured to receive one or more control signals and to allow the electrical current to flow based on the control signal. Discharge circuitry 390 of FIG. 3 and discharge circuitry 490 of FIG. 4A are example arrangements for discharge circuitry 290.

Figure 3:
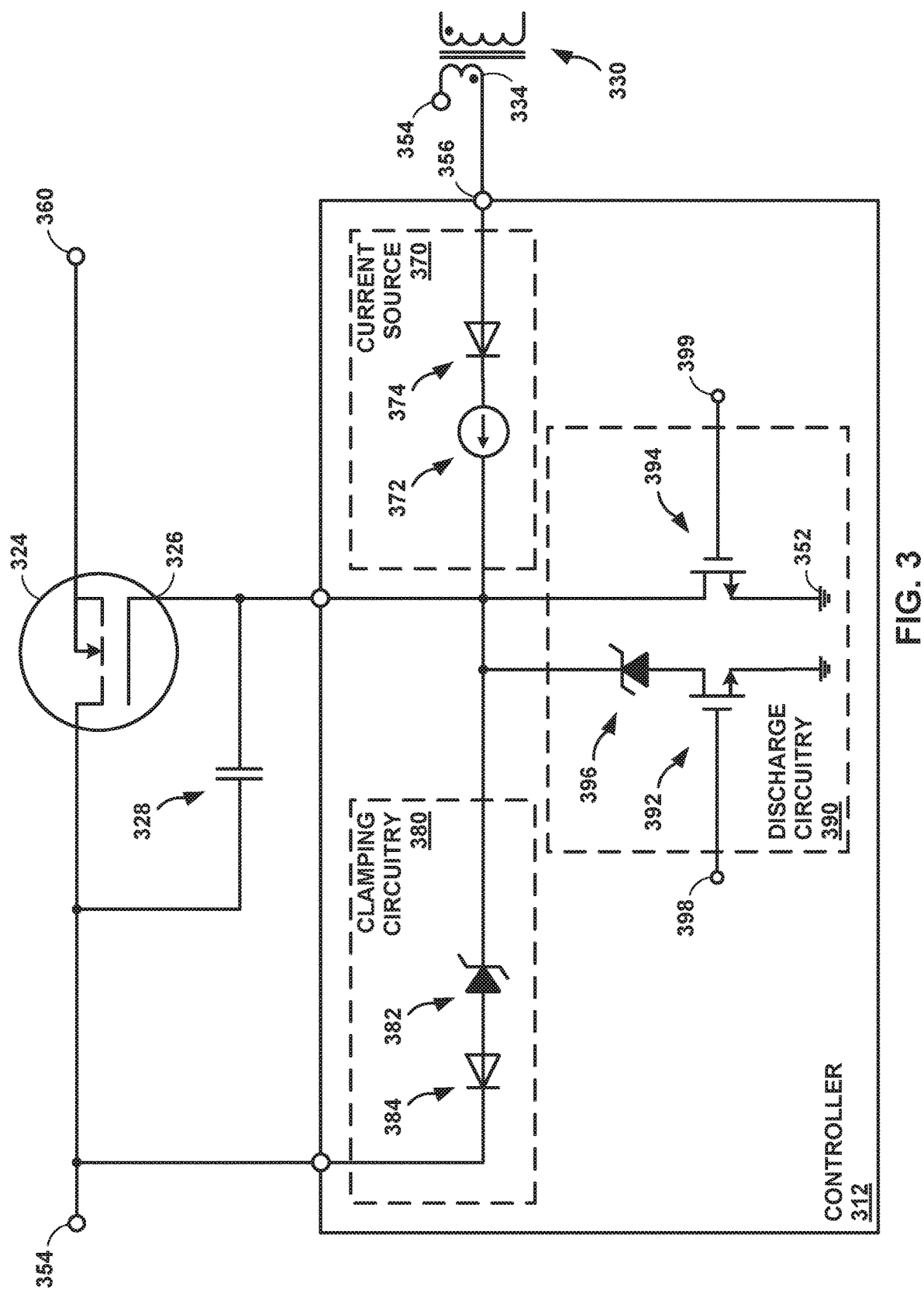
FIG. 3 is a circuit diagram of a controller configured to control a pass switch, in accordance with some examples of this disclosure.
Figure 4A:
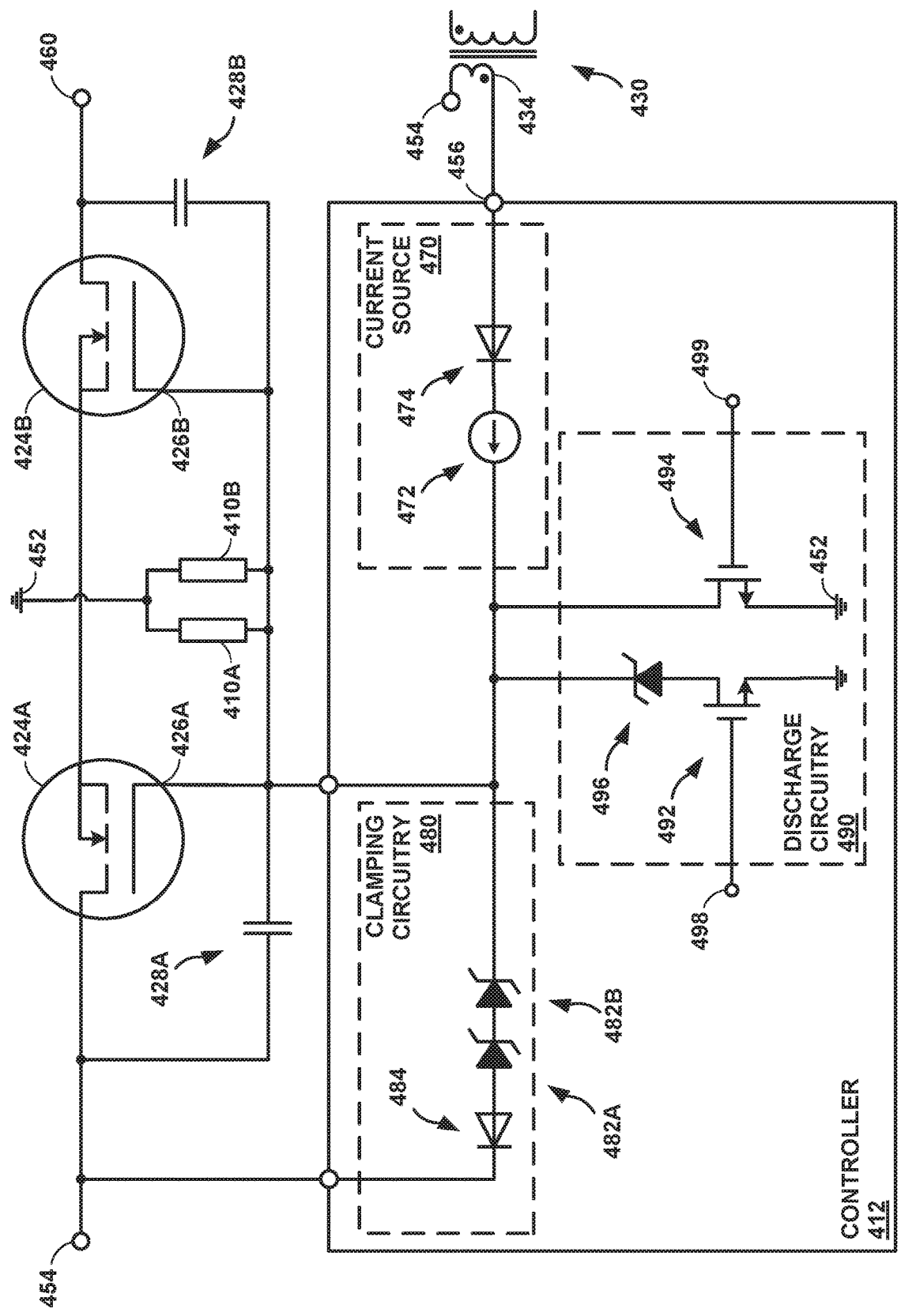
FIG. 4A is a circuit diagram of a controller configured to control two pass switches, in accordance with some examples of this disclosure.

FIG. 3 is a circuit diagram of a controller 312 configured to control a pass switch 324, in accordance with some examples of this disclosure. When current source 370 drives a charging current to control terminal 326, the charging current may increase (i.e., charge or build) the voltage across parasitic capacitance 328. Parasitic capacitance 328 may be the inherent capacitance between control terminal 326 and the drain terminal of pass switch 324, which is electrically connected to output node 354.

Current source 370 may include current source 372 and diode 374. Current source 372 may be configured to turn on and turn off based on a control signal. When current source 372 turns on, current source 372 may be configured to drive an electrical current to control terminal 326. Current source 372 may be configured to "selectively" drive the charging current because an active control signal may cause current source 372 to drive the charging current and an inactive control signal may cause current source 372 to not drive the charging current. Current source 372 may include any type of current source, such as a bootstrapped current source, a current limiting diode, a Zener diode current source, and/or a current mirror. Current source 370 may not include a charge pump, which may result in space and cost savings, as compared to only a current source. Current source 372 may be turned on and off by a switch electrically connected in series with current source 372, where the control signal described above may cause the switch to connect and disconnect current source 372.

Clamping circuitry 380 may include Zener diode 382 and diode 384. Zener diode 382 may be configured to allow electrical current to flow from control terminal 326 to output node 354 when the voltage level of control terminal 326 exceeds the voltage level of output node 354 by at least a threshold level. The threshold level of Zener diode 382 is a design choice and may be between four volts and fifteen volts, between seven volts and twelve volts, between ten volts and twelve volts, or any other voltage level. Diode 384 may be electrically connected in series with Zener diode 382 and configured to allow electrical current to flow from control terminal 326 to output node 354.

Connecting of clamping circuitry 380 to the drain of pass switch 324 (e.g., output node 354) instead of a connection to the source (e.g., bus out node 360) may allow clamping circuitry 380 to safely limit the gate-source voltage level of pass switch 324 without access to the source pin. Clamping circuitry 380 may be configured to clamp the voltage level of control terminal 326 to within a threshold level of the voltage level of output node 354.

Discharge circuitry 390 may include discharge switches 392 and 394 and Zener diode 396 electrically connected in series with discharge switch 392. Discharge switch 392 may be configured to selectively allow electrical current to flow from control terminal 326 to low-side voltage rail 352 based on a control signal received from node 398. Zener diode 396 may be electrically connected in series with discharge switch 392 and configured to allow electrical current to flow from control terminal 326 to low-side voltage rail 352.

Electricity may flow through discharge switch 392 when discharge switch 392 is closed and when the voltage level of control terminal 326 exceeds the voltage level of low-side voltage rail 352 by at least a threshold level. Discharge switch 392 may be configured to discharge control terminal 326 only to the voltage level of low-side voltage rail 352 plus the threshold level. Discharge switch 392 may be configured to discharge control terminal 326 to the voltage level of low-side voltage rail 352 based on a control signal received from node 399.

To turn on pass switch 324, the charging current may flow through diode 374 and current source 372 to charge parasitic capacitance 328 and increase the voltage level of control terminal 326. The voltage level at drain node 356 may be relatively high and the voltage across winding 334 may be relatively high when a primary-side switch is turned on. When the primary-side switch is turned off, the voltage across winding 334 may be relatively low and current source 372 may not be conducting a charging current, but Zener diode 382 may prevent a discharge current unless the voltage level of control terminal 326 exceeds output node 354 by a threshold level. Even without a charging current from current source 372, the voltage level of control terminal 326 may hold relatively constant because of the low leakage currents through clamping circuitry 380, discharge circuitry 390, and parasitic capacitance 328.

When the voltage level across parasitic capacitance 328 is charged to reach voltage level VF+Vzbreak, where VF is the forward voltage of diode 384, and Vzbreak is breakdown voltage of Zener diode 382, electricity may flow from control terminal 326 through clamping circuitry 380 to output node 354. When electricity flows through clamping circuitry 380, the voltage level across parasitic capacitance 328 may be clamped by Zener diode 382 and diode 384. When clamped, the voltage level across parasitic capacitance 328 may stay constant high to turn on pass switch 324.

Turning off pass switch 324 may include two phases. First, current source 372 can be lowered to zero, or nearly zero, amperes, and an active control signal may be delivered through node 398 to discharge switch 392 to discharge the voltage level across parasitic capacitance 328. Zener diode 396 may limit the discharge of the voltage level across parasitic capacitance 328. The voltage level of bus out node 360 may discharge through pass switch before pass switch 324 fully turns off, which may occur when discharge switch 394 turns on.

The second turn-off phase may occur when discharge switch 394 turns on based on the control signal received at node 399. Discharge switch 394 may turn five milliseconds after discharge switch 392 turns on. This time delay may allow for the first turn-off phase to complete. When discharge switch 394 turns on, the voltage level of control terminal 326 may decline to, or nearly to, the voltage level of low-side voltage rail 352, and pass switch 324 may turn off.

There may be a risk to immediately turning off pass switch 324 without the first turn-off phase. For example, if the voltage level of output node 354 is twenty volts, and if pass switch 324 is turned on, the voltage level of bus out node 360 may also be twenty volts. At this time, turning off pass switch 324 may result in the voltage level of control terminal 326 may decline to zero volts in a very short amount of time. Bus out node 360 may have some capacitance and hold the voltage level of bus out node 360 at twenty volts for a while. Thus, the voltage difference between bus out node 360 and control terminal 326 may be minus twenty volts, which may exceed the maximum gate-source voltage of pass switch 324. Pass switch 324 may be damaged when the maximum gate-source voltage is exceeded. The two-phase turn-off process may prevent this situation and may protect pass switch 324.

Zener diodes 382 and 396 may have threshold voltage levels below which Zener diodes 382 and 396 do not reverse-conduct electricity. When forward-conducting electricity, Zener diodes 382 and 396, as well as diodes 374 and 384, may have a voltage drop such as five hundred millivolts, seven hundred millivolts, or one volt. Switches 324, 392, and 394 may also have a voltage drop when conducting electricity.

If output node 354 is suddenly shorted to low-side voltage rail 352 when pass switch 324 is turned on, then the voltage level of control terminal 326 may decrease and pass switch 324 may remain in a safe condition. When output node 354 is shorted to low-side voltage rail 352 and pass switch 324 is turned on, the voltage level of bus out node 360 may also decrease to zero volts (i.e., the voltage level of low-side voltage rail 352). If the voltage level of control terminal 326 remains at twenty-eight volts, for example, the gate-drain interface or the gate-source interface may experience breakdown.

FIG. 4A is a circuit diagram of a controller 412 configured to control two pass switches 424A and 424B, in accordance with some examples of this disclosure. Pass switch 424A may be electrically connected in series with pass switch 424B. The configuration of FIG. 4A may include a higher threshold level for clamping circuitry 480, as compared to clamping circuitry 380 of FIG. 3.

Resistors 410A and 410B may be electrically connected between control terminals 426A and 426B and low-side voltage rail 452. Resistors 410A and 410B may be configured to allow a relatively slow discharge of the voltage level at control terminals 426A and 426B. In some examples, resistors 410A and 410B may each have a resistance of ten megaohms.

There is a risk that the voltage level at drain node 456 may be level for a relatively long time interval when the voltage across winding 434 is low. The voltage across winding 434 may be include a pulse signal that has a high voltage for a short time and a low voltage for a long time. Resistors 410A and 410B may discharge the electrical charge present at control terminals 426A and 426B when the voltage across winding 434 is low. This low voltage may turn off pass switches 424A and 424B, especially during light-load conditions when the off-time of a primary-side switch is relatively long.

To turn on pass switches 424A and 424B, current source 470 may deliver a charging current to control terminals 426A and 426B. The gate-to-source breakdown voltage of each of pass switches 424A and 424B may be twenty volts. Therefore, the voltage level of control terminals 426A and 426B may be designed at the voltage level of output node 454 plus eighteen volts. This design may prevent pass switches 424A and 424B from breaking down, and the discharge time for control terminals 426A and 426B may be longer during off-times.

Figure 4B:
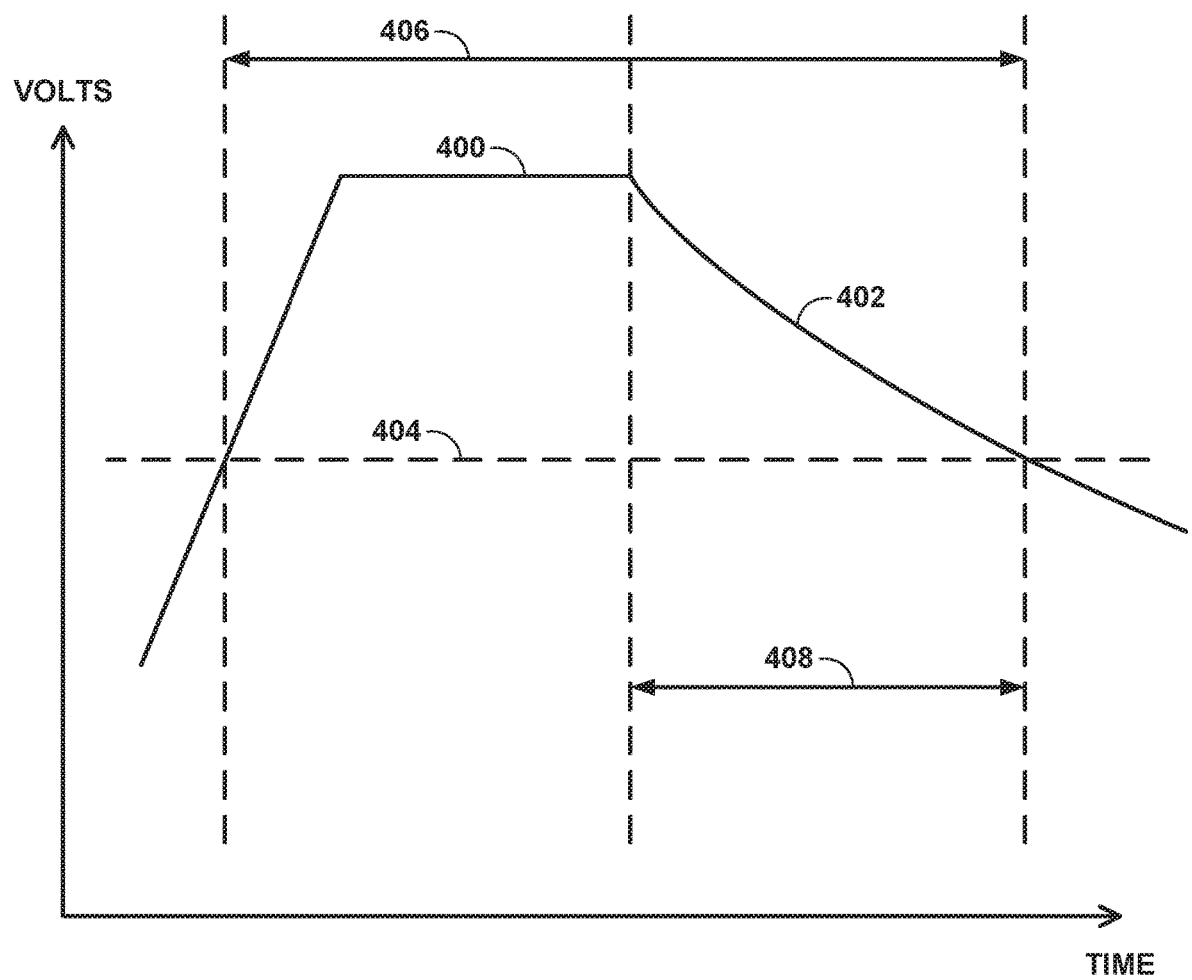
FIG. 4B is a graph of the voltage level of the control terminals of two pass switches, in accordance with some examples of this disclosure.

FIG. 4B is a graph of the voltage level of control terminals 426A and 426B of pass switches 424A and 424B, in accordance with some examples of this disclosure. Voltage level 400 may be the threshold level for clamping circuitry 480, such as twenty volts, twenty-one volts, or twenty-two volts. Voltage slope 402 may occur when current source 470 stop driving a charging current to control terminals 426A and 426B. The declining voltage level of voltage slope 402 may be caused by the electrical current flowing through resistors 410A and 410B to low-side voltage rail 452.

Above voltage level 404, pass switches 424A and 424B may be turned on. In some examples, the turn-on voltage of each of pass switches 424A and 424B may be seven volts, such that voltage level 404 is seven volts higher than the voltage level at output node 454. The turn-on voltage for each of pass switches 424A and 424B may be referred to as "VGS" if pass switches 424A and 424B include NMOSFETs. Time interval 406 may be the time duration that the voltage level of control terminals 426A and 426B is greater than voltage level 404. Time interval 408 may be approximately twenty-two microseconds, which is the time duration for voltage level 400 to discharge by voltage slope 402 to voltage level 404 when the turn-on threshold of pass switches 424A and 424B may not be high enough. FIG. 4B shows that there may be a discharge path to low-side voltage rail 452, but controller 412 still can hold the voltage level of control terminal 426 (e.g., VGS) to be a high enough voltage level for a long time.

Figure 5:
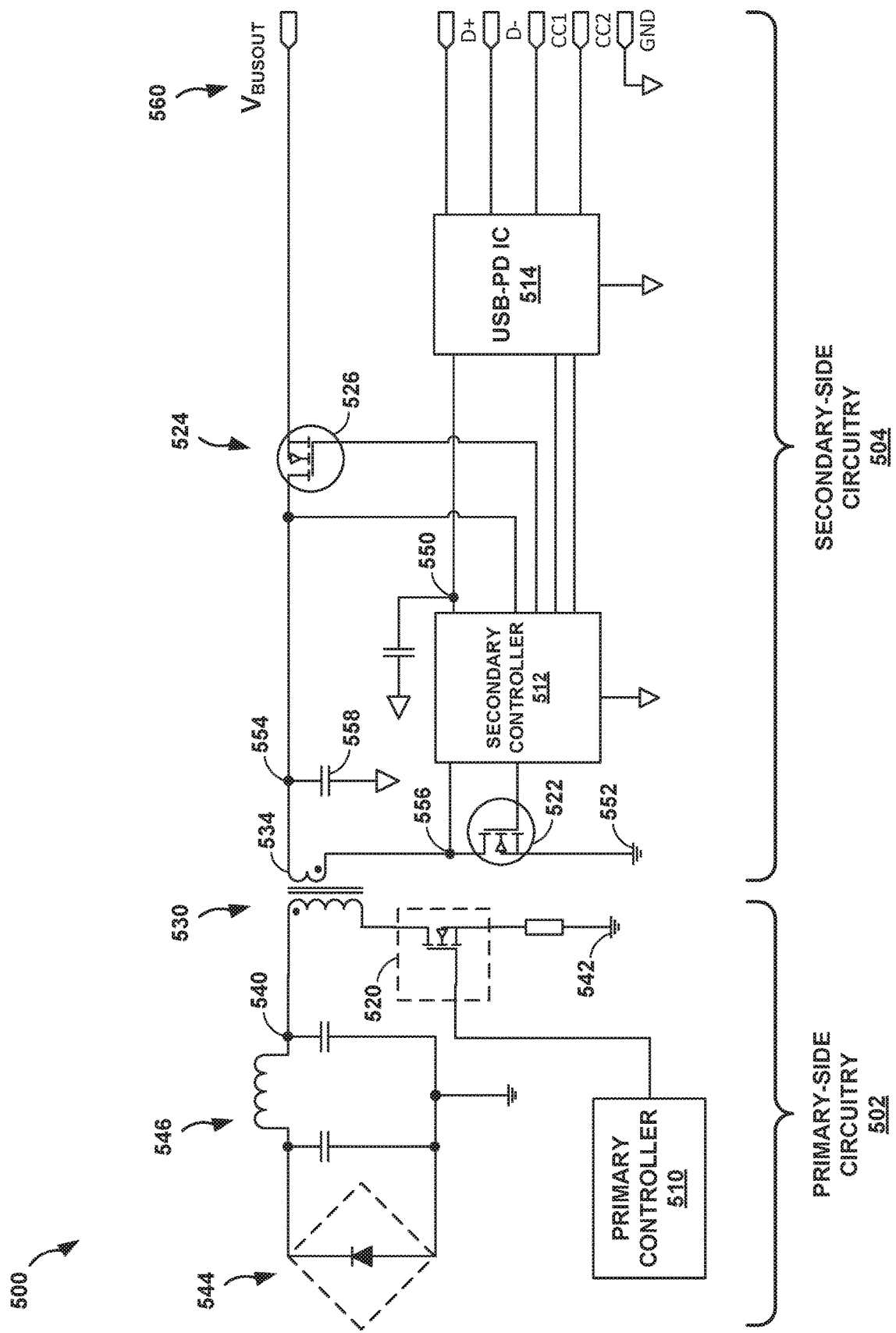
FIG. 5 is a circuit diagram of a power-delivery system, in accordance with some examples of this disclosure.

FIG. 5 is a circuit diagram of a power-delivery system 500, in accordance with some examples of this disclosure. Power-delivery system 500 may be configured to deliver electrical power at bus out node 560. Power-delivery system 500 may receive AC electrical power at rectification circuitry 544. Rectification circuitry 544 and inductor 546 may be configured to convert the AC electrical power to a DC voltage signal. In some examples, power-delivery system 500 may include a USB-PD system. Primary controller 510 may be configured to control primary switch 520 to deliver electrical power through transformer 530 to secondary-side circuitry 504. Secondary controller 512 may be configured to control secondary switch 522 (i.e., power switch 522) and pass switch 524. USB-PD controller 514 may be configured to deliver and receive signals from nodes or pins D+, D−, CC1, and CC2.

Secondary controller 512 may include a current source configured to drive a charging current from drain node 556, rather than voltage rail 550, to control terminal 526. Voltage rail 550 may receive electrical power from a rectified power supply that has a lower voltage level than intermediate node 556, which may receive electrical power from winding 534. By using intermediate node 556 to supply controller 512 for turning on pass switch 524, USB-PD controller 514 may not need to control the operation of pass switch 524. Power-delivery system 500 may include a lower voltage level for voltage rail 550, as compared to another system with a controller that drives a charging current from a $V_{CC}$ voltage rail to turn on a pass switch. Controller 512 may experience lower power loss, as compared to a controller that drives a charging current from a $V_{CC}$ voltage rail to turn on a pass switch.

USB-PD controller 514 (e.g., USB controller 514) may be configured to receive signals from pins D+, D−, CC1, and CC2. USB-PD controller 514 may be configured to control the delivery or receipt of electrical power at bus out node 560. USB-PD controller 514 may have communication links with secondary controller 512. Controllers 512 and 514 may be configured to receive power supply signals from voltage rail 550.

Figure 6:
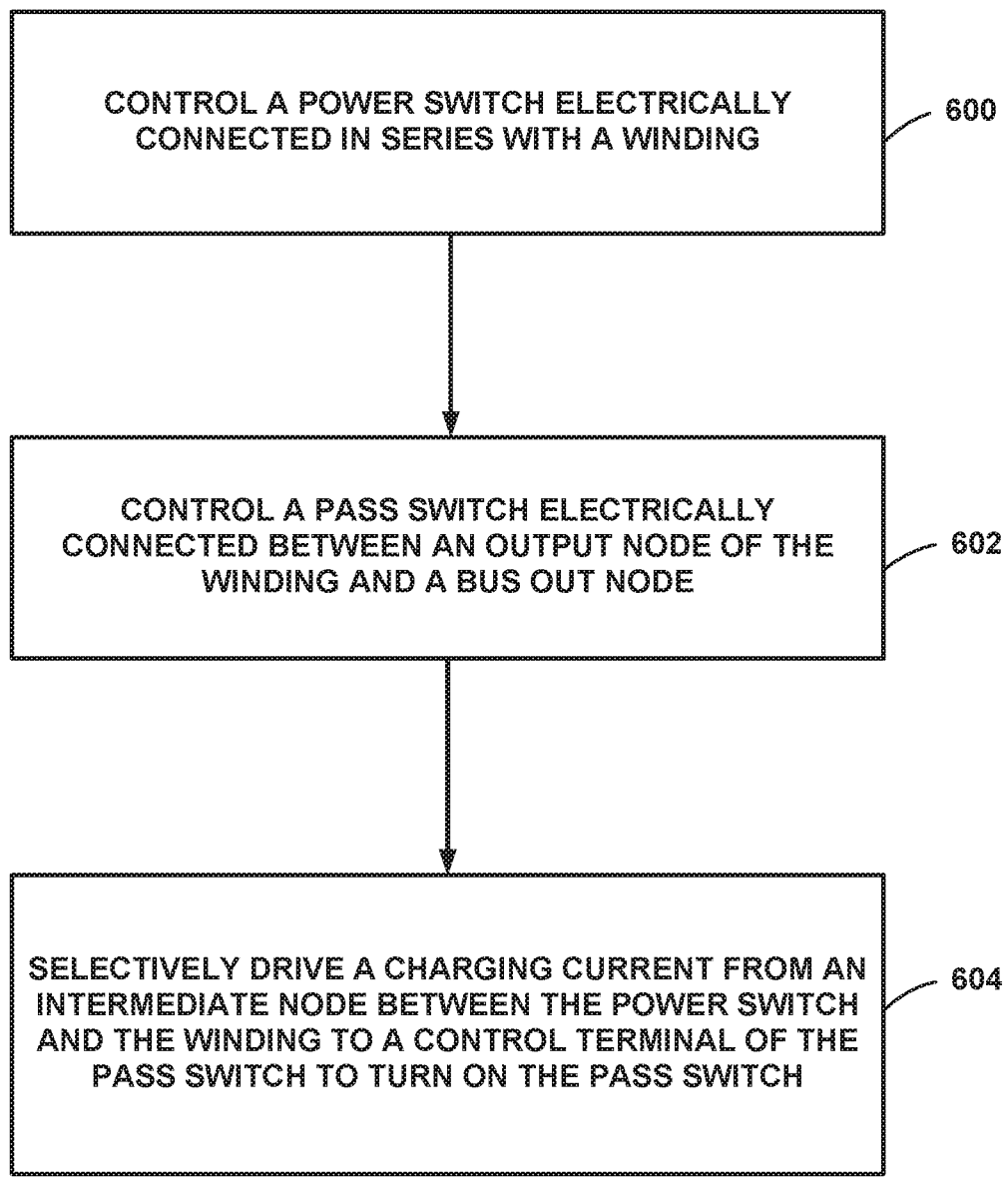
FIG. 6 is flowchart illustrating example technique for controlling a pass switch by a current source, in accordance with some examples of this disclosure.

FIG. 6 is flowchart illustrating example techniques for controlling a pass switch by a current source, in accordance with some examples of this disclosure. The example techniques of FIG. 6 are described with reference to controller 212 in FIG. 2, although other components, such as controllers 112, 312, and 412 of FIGS. 1, 3, and 4, may exemplify similar techniques.

In the example of FIG. 6, controller 212 controls power switch 222 electrically connected in series with winding 234 (600). Controller 212 may deliver driver signals to cause power switch 222 to turn on and off. When power switch 222 is turned on, power switch 222 may conduct electricity between intermediate node 234 and low-side voltage rail 252.

In the example of FIG. 6, controller 212 controls pass switch 224 electrically connected between output node 254 and bus out node 260 (602). Controller 212 may deliver a voltage signal to control terminal 226 to cause pass switch 224 turn on and off. In the example of FIG. 6, current source 270 selectively drives a charging current from intermediate node 256 to control terminal 226 of pass switch 224 to turn on pass switch 224 (604). Current source 270 may be activated and deactivated by a control signal.

Using current source 270, rather than a charge pump, to drive a charging current may result in less chip space and less complex circuitry. In addition, current source 270 may be configured to drive the charging current to control terminal 226 from intermediate node 256, which may provide a more stable power supply and a higher voltage level. The voltage level of intermediate node 256 may be high enough to supply the charging current for current source 270, such that a charge pump is not necessary for controller 212 to turn on pass switch 224.

The following numbered examples demonstrate one or more aspects of the disclosure. Each example is described with respect to one or more figures. The reference to one or more figures is not intended to limit the scope of an example to the referenced figures.

Example 1

A controller is configured to control a power switch electrically connected in series with a winding. The controller is also configured to control a pass switch electrically connected between an output node of the winding and a bus out node. The controller includes a current source configured to selectively drive a charging current from an intermediate node between the power switch and the winding to a control terminal of the pass switch to turn on the pass switch.

Example 2

The controller of example 1, further comprising clamping circuitry configured to allow an electrical current to flow from the control terminal to the output node when a voltage level of the control terminal exceeds a voltage level of the output node by at least a threshold level.

Example 3

The controller of example 2, wherein the clamping circuitry comprises a Zener diode configured to allow electrical current to flow from the control terminal to the output node when a voltage level of the control terminal exceeds the voltage level of the output node by at least the threshold level. The clamping circuitry further comprises a diode electrically connected in series with the Zener diode, wherein the diode is configured to allow electrical current to flow from the control terminal to the output node.

Example 4

The controller of examples 1-3 or any combination thereof, wherein the controller is configured to control the pass switch by at least controlling an n-type metal-oxide-semiconductor field-effect transistor (NMOSFET) including a drain terminal electrically connected to the output node and a source terminal electrically connected to the bus out node, and the control terminal is a gate terminal of the NMOSFET. The clamping circuitry is configured to allow the electrical current to flow by at least allowing the electrical current to flow from the control terminal to the drain terminal when the voltage level of the control terminal exceeds a voltage level of the drain terminal by at least the threshold level.

Example 5

The controller of examples 1-4 or any combination thereof, further including a low-side voltage rail and discharge circuitry configured to receive a control signal and selectively allow electrical current to flow from the control terminal to the low-side voltage rail to turn off the pass switch based on the control signal.

Example 6

The controller of examples 1-5 or any combination thereof, wherein the control signal is a second control signal, and the discharge circuitry comprises a first discharge switch configured to receive the first control signal and selectively allow electrical current to flow from the control terminal to the low-side voltage rail based on the first control signal. The discharge circuitry further comprises a Zener diode electrically connected in series with the first discharge switch, wherein the Zener diode is configured to allow electrical current to flow from the control terminal to the low-side voltage rail when the first discharge switch is closed and a voltage level of the control terminal exceeds a voltage level of the low-side voltage rail by at least a threshold level. The discharge circuitry further comprises a second discharge switch configured to receive a second control signal and selectively allow electrical current to flow from the control terminal to the low-side voltage rail to turn off the pass switch based on the second control signal.

Example 7

The controller of examples 1-6 or any combination thereof, further comprising a diode electrically connected in series with the current source, wherein the diode is configured to allow electrical current to flow from the intermediate node to the control terminal.

Example 8

The controller of examples 1-7 or any combination thereof, wherein the pass switch is a first pass switch, the control terminal of the first pass switch is a first control terminal, and the controller is further configured to control a second pass switch electrically connected in series with the first pass switch. The current source is configured to selectively drive the charging current from the intermediate node to a second control terminal of the second pass switch to turn on the second pass switch.

Example 9

The controller of example 8, wherein the clamping circuitry is configured to allow electrical current to flow from the first control terminal and the second control terminal to the output node when a voltage level of the first control terminal and the second control terminal exceeds a voltage level of the output node by at least a threshold level.

Example 10

The controller of example 9, wherein the clamping circuitry comprises at least two Zener diodes configured to allow electrical current to flow from the first control terminal and the second control terminal to the output node when the voltage level of the first control terminal and the second control terminal exceeds the voltage level of the output node by at least the threshold level. The clamping circuitry further comprises a diode electrically connected in series with the at least two Zener diodes, wherein the diode is configured to allow electrical current to flow from the first control terminal and the second control terminal to the output node.

Example 11

A method includes controlling, by a controller, a power switch electrically connected in series with a winding. The method also includes controlling, by the controller, a pass switch electrically connected between an output node of the winding and a bus out node. Controlling the pass switch comprises selectively driving, by a current source of the controller, a charging current from an intermediate node between the power switch and the winding to a control terminal of the pass switch to turn on the pass switch.

Example 12

The method of example 11, further comprising allowing, by a Zener diode, electrical current to flow from the control terminal to the output node when a voltage level of the control terminal exceeds a voltage level of the output node by at least a threshold level.

Example 13

The method of examples 11-12 or any combination thereof, further comprising receiving a first control signal at a first discharge switch and allowing electrical current to flow from the control terminal to the low-side voltage rail through the first discharge switch and a Zener diode based on the first control signal and when a voltage level of the control terminal exceeds a voltage level of the low-side voltage rail by at least a threshold level. The method further includes receiving a second control signal at a second discharge switch and allowing electrical current to flow from the control terminal to the low-side voltage rail through the second discharge switch to turn off the pass switch based on the second control signal.

Example 14

The method of examples 11-13 or any combination thereof, wherein the pass switch is a first pass switch, and the control terminal of the first pass switch is a first control terminal. The method further comprises controlling a second pass switch electrically connected in series with the first pass switch and wherein selectively driving the charging current comprises selectively driving the charging current from the intermediate node to a second control terminal of the second pass switch to turn on the second pass switch.

Example 15

A system includes primary-side circuitry including a primary-side switch, a primary-side winding of a transformer, and a primary-side controller configured to control the primary-side switch. The system also includes secondary-side circuitry including a secondary-side switch and a secondary-side winding of the transformer magnetically coupled to the primary side and electrically connected in series with the secondary-side switch through an intermediate node. The secondary-side circuitry also includes a bus out node configured to deliver electrical power to an electrical load and a pass switch configured to conduct electricity from an output node of the secondary-side winding to the bus out node. The secondary-side circuitry further includes a secondary-side controller configured to control the secondary-side switch and the pass switch, wherein the secondary-side controller comprises a current source configured to selectively drive a charging current from the intermediate node between the secondary-side switch and the secondary-side winding to a control terminal of the pass switch to turn on the pass switch.

Example 16

The system of example 15, wherein the secondary-side controller further comprises clamping circuitry configured to allow an electrical current to flow from the control terminal to the output node when a voltage level of the control terminal exceeds a voltage level of the output node by at least a threshold level.

Example 17

The system of example 16, wherein the pass switch includes an n-type metal-oxide-semiconductor field-effect transistor (NMOSFET) including a drain terminal electrically connected to the output node and a source terminal electrically connected to the bus out node, and the control terminal is a gate terminal of the NMOSFET. The clamping circuitry is configured to allow the electrical current to flow by at least allowing the electrical current to flow from the control terminal to the drain terminal when the voltage level of the control terminal exceeds a voltage level of the drain terminal by at least the threshold level.

Example 18

The system of examples 15-17 or any combination thereof, wherein the secondary-side circuit further comprises a low-side voltage rail, and the secondary-side controller further comprises discharge circuitry configured to receive a control signal and selectively allow electrical current to flow from the control terminal to the low-side voltage rail to turn off the pass switch based on the control signal.

Example 19

The system of examples 15-18 or any combination thereof, wherein the secondary-side controller further comprises a diode electrically connected in series with the current source, wherein the diode is configured to allow electrical current to flow from the intermediate node to the control terminal.

Example 20

The system of examples 15-19 or any combination thereof, wherein the system is a Universal Serial Bus-Power Delivery (USB-PD) system. The secondary-side circuitry further includes two or more USB pins and a USB controller configured to receive signals from the two or more USB pins.

Example 21

The system of examples 15-20 or any combination thereof, wherein the pass switch is a first pass switch, and the control terminal of the first pass switch is a first control terminal. The secondary-side circuitry further comprises a second pass switch electrically connected in series with the first pass switch, wherein the secondary-side controller is further configured to control the second pass switch. The current source is configured to selectively drive the charging current from the intermediate node to a second control terminal of the second pass switch to turn on the second pass switch.

Various examples of the disclosure have been described. Any combination of the described systems, operations, or functions is contemplated. These and other examples are within the scope of the following claims.

What is claimed is:

1. A controller configured to:
control a power switch electrically connected in series between a winding and a voltage rail; and
control a pass switch electrically connected between an output node of the winding and a bus out node,
wherein the pass switch is electrically connected between a smoothing capacitor and the bus out node,
wherein a load terminal of the pass switch is directly electrically connected to the bus out node, and
wherein the controller comprises a current source configured to selectively drive a charging current from an intermediate node between the power switch and the winding to a control terminal of the pass switch to turn on the pass switch.

2. The controller of claim 1, further comprising clamping circuitry configured to allow an electrical current to flow from the control terminal to the output node when a voltage level of the control terminal exceeds a voltage level of the output node by at least a threshold level.

3. The controller of claim 2, wherein the clamping circuitry comprises:
a Zener diode configured to allow electrical current to flow from the control terminal to the output node when a voltage level of the control terminal exceeds the voltage level of the output node by at least the threshold level; and a diode electrically connected in series with the Zener diode, wherein the diode is configured to allow electrical current to flow from the control terminal to the output node.

4. The controller of claim 2,
wherein the load terminal of the pass switch comprises a source terminal of the pass switch,
wherein the controller is configured to control the pass switch by at least controlling an n-type metal-oxide-semiconductor field-effect transistor (NMOSEFT) including a drain terminal electrically connected to the output node and the source terminal electrically connected to the bus out node,
wherein the control terminal is a gate terminal of the NMOSFET, and
wherein the clamping circuitry is configured to allow the electrical current to flow by at least allowing the electrical current to flow from the control terminal to the drain terminal when the voltage level of the control terminal exceeds a voltage level of the drain terminal by at least the threshold level.

5. The controller of claim 1, wherein the voltage rail comprises an external low-side voltage rail, the controller further comprising:
an internal low-side voltage rail connected to the external low-side voltage rail; and
discharge circuitry configured to:
receive a control signal; and
selectively allow electrical current to flow from the control terminal to the internal low-side voltage rail to turn off the pass switch based on the control signal.

6. The controller of claim 5, wherein the control signal is a second control signal, and wherein the discharge circuitry comprises:
a first discharge switch configured to:
receive the first control signal; and
selectively allow electrical current to flow from the control terminal to the internal low-side voltage rail based on the first control signal;
a Zener diode electrically connected in series with the first discharge switch, wherein the Zener diode is configured to allow electrical current to flow from the control terminal to the internal low-side voltage rail when the first discharge switch is closed and a voltage level of the control terminal exceeds a voltage level of the internal low-side voltage rail by at least a threshold level; and
a second discharge switch configured to:
receive a second control signal; and
selectively allow electrical current to flow from the control terminal to the internal low-side voltage rail to turn off the pass switch based on the second control signal.

7. The controller of claim 1, further comprising a diode electrically connected in series with the current source, wherein the diode is configured to allow electrical current to flow from the intermediate node to the control terminal.

8. The controller of claim 1,
wherein the pass switch is a first pass switch,
wherein the control terminal of the first pass switch is a first control terminal,
wherein the controller is further configured to control a second pass switch electrically connected in series with the first pass switch, and wherein the current source is configured to selectively drive the charging current from the intermediate node to a second control terminal of the second pass switch to turn on the second pass switch.

9. The controller of claim 8, wherein the clamping circuitry is configured to allow electrical current to flow from the first control terminal and the second control terminal to the output node when a voltage level of the first control terminal and the second control terminal exceeds a voltage level of the output node by at least a threshold level.

10. The controller of claim 9, wherein the clamping circuitry comprises:
at least two Zener diodes configured to allow electrical current to flow from the first control terminal and the second control terminal to the output node when the voltage level of the first control terminal and the second control terminal exceeds the voltage level of the output node by at least the threshold level; and
a diode electrically connected in series with the at least two Zener diodes, wherein the diode is configured to allow electrical current to flow from the first control terminal and the second control terminal to the output node.

11. A method comprising:
controlling, by a controller, a power switch electrically connected in series between a winding and a voltage rail; and
controlling, by the controller, a pass switch electrically connected between an output node of the winding and a bus out node,
wherein the pass switch is electrically connected between a smoothing capacitor and the bus out node,
wherein a load terminal of the pass switch is directly electrically connected to the bus out node, and
wherein controlling the pass switch comprises selectively driving, by a current source of the controller, a charging current from an intermediate node between the power switch and the winding to a control terminal of the pass switch to turn on the pass switch.

12. The method of claim 11, further comprising allowing, by a Zener diode, electrical current to flow from the control terminal to the output node when a voltage level of the control terminal exceeds a voltage level of the output node by at least a threshold level.

13. The method of claim 11, wherein the voltage rail comprises a low-side voltage rail, the method further comprising:
receiving a first control signal at a first discharge switch;
allowing electrical current to flow from the control terminal to the low-side voltage rail through the first discharge switch and a Zener diode based on the first control signal and when a voltage level of the control terminal exceeds a voltage level of the low-side voltage rail by at least a threshold level;
receiving a second control signal at a second discharge switch; and
allowing electrical current to flow from the control terminal to the low-side voltage rail through the second discharge switch to turn off the pass switch based on the second control signal.

14. The method of claim 11,
wherein the pass switch is a first pass switch,
wherein the control terminal of the first pass switch is a first control terminal,
wherein the method further comprises controlling a second pass switch electrically connected in series with the first pass switch, and wherein selectively driving the charging current comprises selectively driving the charging current from the intermediate node to a second control terminal of the second pass switch to turn on the second pass switch.

15. A system comprising:
primary-side circuitry including:
   a primary-side switch;
   a primary-side winding of a transformer, and
   a primary-side controller configured to control the primary-side switch; and
secondary-side circuitry including:
   a secondary-side switch;
   a secondary-side winding of the transformer magnetically coupled to the primary side and electrically connected in series with the secondary-side switch through an intermediate node;
   a voltage rail, wherein the secondary-side switch is electrically connected in series between the secondary-side winding and the voltage rail;
   a bus out node configured to deliver electrical power to an electrical load;
   a pass switch configured to conduct electricity from an output node of the secondary-side winding to the bus out node, wherein the pass switch is electrically connected between a smoothing capacitor and the bus out node, wherein a load terminal of the pass switch is directly electrically connected to the bus out node; and
   a secondary-side controller configured to control the secondary-side switch and the pass switch, wherein the secondary-side controller comprises a current source configured to selectively drive a charging current from the intermediate node between the secondary-side switch and the secondary-side winding to a control terminal of the pass switch to turn on the pass switch.

16. The system of claim 15, wherein the secondary-side controller further comprises clamping circuitry configured to allow an electrical current to flow from the control terminal to the output node when a voltage level of the control terminal exceeds a voltage level of the output node by at least a threshold level.

17. The system of claim 16,
wherein the load terminal of the pass switch comprises a source terminal of the pass switch,
wherein the pass switch includes an n-type metal-oxide-semiconductor field-effect transistor (NMOSFET) including a drain terminal electrically connected to the output node and the source terminal electrically connected to the bus out node,
wherein the control terminal is a gate terminal of the NMOSFET, and
wherein the clamping circuitry is configured to allow the electrical current to flow by at least allowing the electrical current to flow from the control terminal to the drain terminal when the voltage level of the control terminal exceeds a voltage level of the drain terminal by at least the threshold level.

18. The system of claim 15, wherein the voltage rail comprises a low-side voltage rail, and wherein the secondary-side controller further comprises discharge circuitry configured to:
   receive a control signal; and
   selectively allow electrical current to flow from the control terminal to the low-side voltage rail to turn off the pass switch based on the control signal.

19. The system of claim 15, wherein the system is a Universal Serial Bus-Power Delivery (USB-PD) system, wherein the secondary-side circuitry further includes:
   two or more USB pins; and
   a USB controller configured to receive signals from the two or more USB pins.

20. The system of claim 15,
wherein the pass switch is a first pass switch,
wherein the control terminal of the first pass switch is a first control terminal,
wherein the secondary-side circuitry further comprises a second pass switch electrically connected in series with the first pass switch,
wherein the secondary-side controller is further configured to control the second pass switch, and
wherein the current source is configured to selectively drive the charging current from the intermediate node to a second control terminal of the second pass switch to turn on the second pass switch.

* * * * *